United States Patent [19]

Coats, Jr.

[11] 3,970,869
[45] July 20, 1976

[54] LOW POWER DRIVER
[75] Inventor: Charles L. Coats, Jr., Laurel, Md.
[73] Assignee: The United States of America as represented by the Secretary of the Navy, Washington, D.C.
[22] Filed: Mar. 3, 1975
[21] Appl. No.: 554,894

[52] U.S. Cl. .............................. 307/251; 307/237; 307/255; 307/270; 330/38 R
[51] Int. Cl.² .................. H03K 17/00; H03K 17/60
[58] Field of Search .......... 307/251, 255, 279, 270, 307/304; 330/38

[56] References Cited
UNITED STATES PATENTS 3,386,053  5/1968  Priddy .............................. 307/251
3,414,737  12/1968  Bowers, Jr. ......................... 307/251
3,558,921  1/1971  Yokozawa .......................... 307/251
3,582,975  6/1971  King ................................. 307/279

Primary Examiner—Stanley D. Miller, Jr.
Assistant Examiner—B. P. Davis
Attorney, Agent, or Firm—R. S. Sciascia; R. E. O'Neill

[57] ABSTRACT

The invention disclosed in this application is a unique semiconductor circuit for switching operations for a computer. It has low power drain characteristics and provides overload protection to the whole system. More specifically, it includes a metallic oxide silicon field effect transistor and a diode connected between a pair of transistors, the first of which receives the switching signal and the second that switches a device.

4 Claims, 2 Drawing Figures

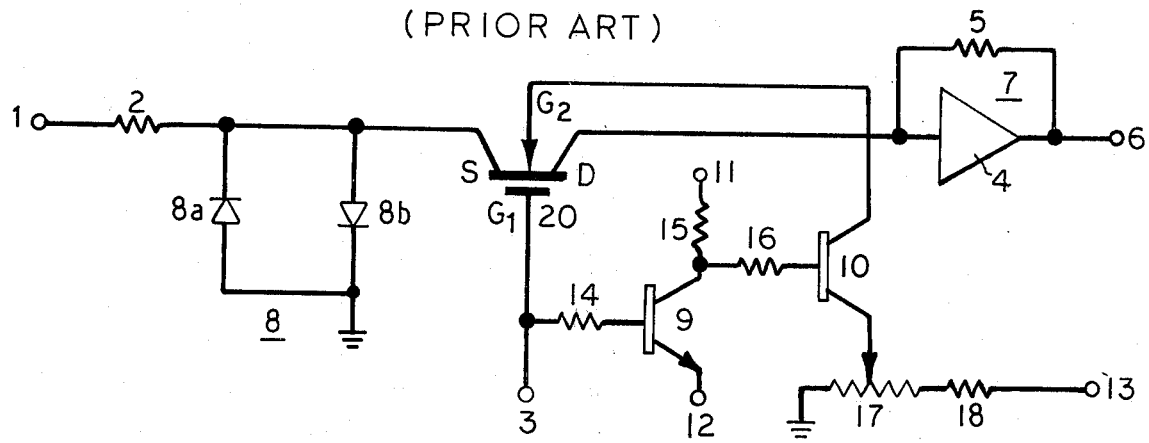
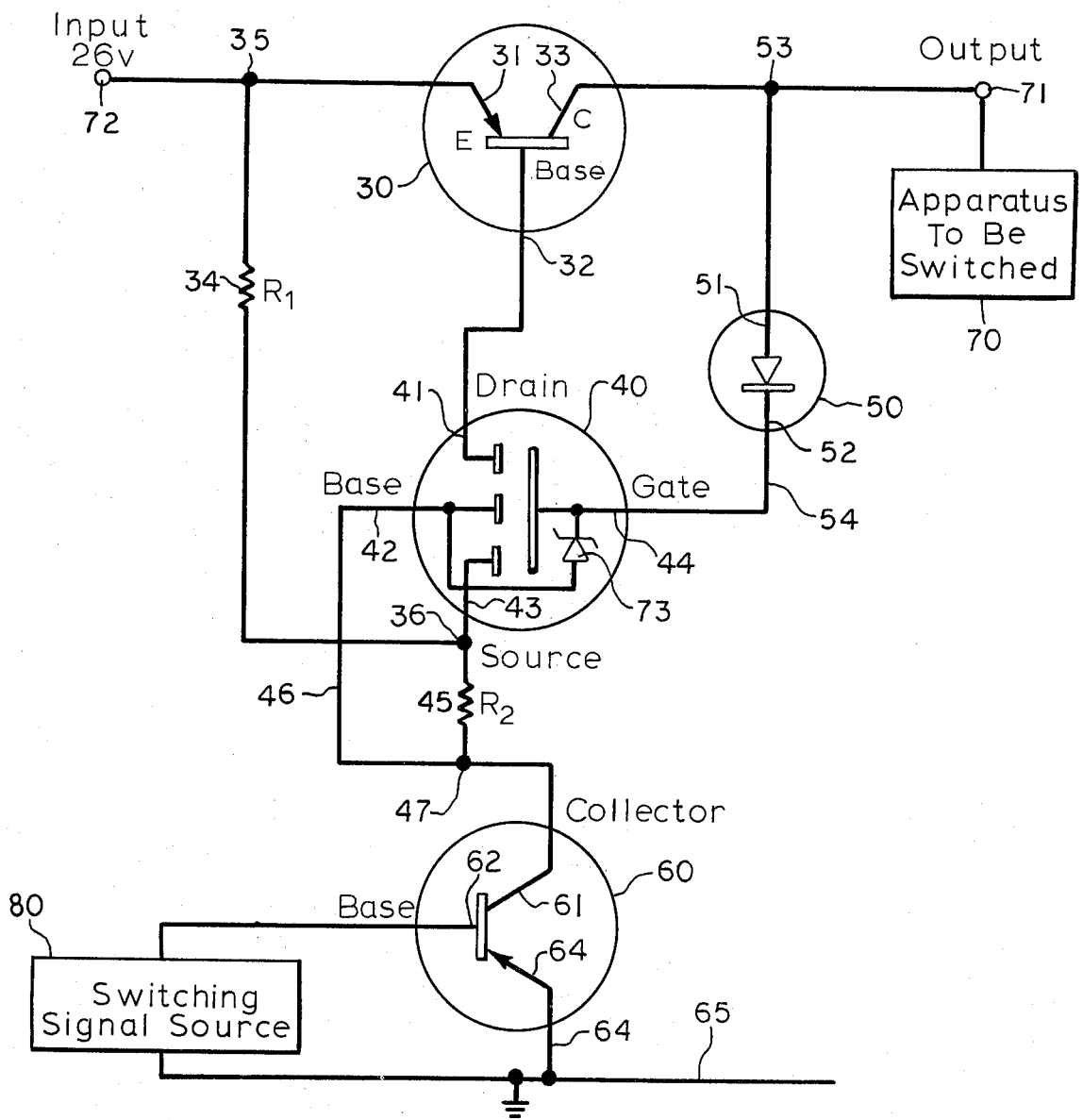

LOW POWER DRIVER

The invention described herein may be manufactured and used by or for the Government of the United States of America for governmental purposes without the payment of any royalties thereon or therefor.

It is common in low-level switching applications to connect the collector-emitter current paths of two transistors in series between a signal source and a load, the transistors being connected in opposition to cancel the collector-emitter voltage drops, and simultaneously drive into either saturation or cutoff to close or open the switch respectively. The base current for the transistors is ordinarily supplied by a transformer coupling arrangement which serves to isolate the transistors from ground and from the driving source. However, switching applications which require isolation are not compatible with transformers in the integrated circuit approach to microminiaturization wherein all of the elements of a circuit are formed in or on a wafer of semiconductor material.

It is obvious from the prior art as set forth hereinafter and other places that are available that many modifications and improvements are possible in switching techniques.

It is therefore an object of this invention to provide an improved low power driver high speed switching circuit for computer logic systems.

It is a further object of this invention to provide an improved switching circuit utilizing a transistor receiving a switching signal and a transmitter to do the switching, to have a MOSFET transistor and diode coupled between the two transistors to improve switching techniques.

It is still a further object of this invention to provide a transistorized low power driver switching circuit having four semi-conductor devices, the first of which performs the switching functions, the second receiving the switching signal, the third a MOSFET coupled therebetween and a diode connected to aid in control of the MOSFET transistor. It is yet a further object of this invention to provide an improved low power driver switching circuit having unique capabilities of high speed switching between on and off and having a very low current drain comprising, a first semi-conductor device having base, emitter, and collector electrodes, a second semi-conductor device having source, drain, base, and gate electrodes, a third semi-conductor having anode and cathode electrodes, a fourth semi-conductor device having base emitter and collector electrodes, an input power circuit including a voltage dividing network, an output terminal coupled to a device to be switched, means for connecting the emitter electrode of the first semi-conductor device to the positive terminal of the input circuit, for connecting the collector electrode of the first semi-conductor device to the output terminal, and for connecting the base electrode to the drain electrode of the second semi-conductor device, means for connecting the third semi-conductor device between the collector electrode of the first semi-conductor device and the gate electrode of the second semi-conductor device, means for connecting the source electrode of the second semi-conductor device to a predetermined point in the input voltage divider network, means connecting the fourth semiconductor device between ground and one end of the voltage dividing network, the fourth semi-conductor device receiving switching signals and initiating switching operations, means for connecting the base electrode of the second semi-conductor device to the low voltage end of the input voltage divider, the third semi-conductor device maintaining the voltage at the gate electrode of the second device at substantially the input voltage until switching operations is initiated, the voltage dividing network causing voltage at the source electrode to go negative with regard to the input voltage upon initiation of the switching operation, the voltage causing a very rapid switching in response to the initiation of the switching cycle.

Other objects, advantages and novel features of the invention will become apparent from the following detailed description of the invention when considered in conjunction with the accompanying drawings wherein:

FIG. 1 shows one form of the prior art and
FIG. 2 is a preferred embodiment of the invention.

Referring now to FIG. 1, a prior art circuit, there is shown an analogue signal contact using a MOS-type FET device 20, a transistor switch 9 connected by the base electrode thereof through a resistor 14 to the first gate electrode $G_1$, a transistor switch 10 connected by the collector electrode thereof to the second gate electrode $G_2$ and by the base electrode thereof to the collector electrode of transistor 9 through resistor 16. Resistors 15, 17 and 18, input terminal 11 for connection to a power supply, and input terminals 12 and 13 are provided as a bias voltage supply. A limiter 8 consisting of oppositely poled diodes 8a and 8b connected between the source electrode and ground, may be employed as an input voltage limiting circuit.

Now let it be assumed that both the source electrode S and the drain electrode D of the FET device 20 are of N-type construction and the substrate connected to gate electrode $G_2$ of device 20 is of P-type construction, where the control signal voltage impressed on gate electrode $G_1$ via terminal 3 goes sufficiently negative in reference to the voltage at the source electrode S, device 20 is cutoff, transistor 9 is cutoff and transistor 10 conducts. Thus, the substrate of device 20 is grounded through the transistor 10.

When a positive signal is applied to device 20, transistor 9 conducts and transistor 10 is cutoff causing electrode $G_2$ to be isolated from ground. Leakage current which may flow through the substrate to operational amplifier 4 and its feedback network to output terminal is decreased. This occurs both in the switch closed and switch open positions.

The improved circuitry of this invention is shown in FIG. 2, a preferred embodiment of the invention that includes a switching transistor 30 having a emitter electrode 31, base electrode 32, and collector electrode 33. A metallic oxide silicon field effect transistor 40, sometimes designated as a MOSFET has a drain electrode 41, base electrode 42, source electrode 43, and a gate electrode 44. A diode 50 has an anode electrode 51 and a cathode electrode 52. There is a fourth semi-conductor device in this circuit, transistor 60 having collector electrode 61, base electrode 62, and emitter electrode 63.

The function of this circuit is to switch a device 70 coupled to an output terminal 71. A point designated as input 72 is maintained at a positive 26 volts, a resistance 34 is connected to the 26 volts as is emitter electrode 31 at junction 35 and the other end of resistance 34 is connected at junction 36 to source electrode 43 of MOSFET 40. A second resistance 45 is connected to junction 36 at one end and to collector electrode 61 on the other end. Base electrode 42 of MOSFET 40 is connected thru lead 46 to the collector electrode 61 at junction 47.

The diode 50 is connected at junction 53 to output terminal 71 and to collector electrode 33 of switching transistor 30. The cathode terminal 52 of diode 50 is connected to gate 44 of MOSFET 40 via lead 54.

Completing the circuitry is a lead 64 connecting emitter 63 to ground bus 65 and a source of switching signals 80 connected between base 62 of transistor 60 and ground bus 65.

Initially, operating condition without any switching signal is as follows.

The 26 volts between point 72 and ground or zero potential is distributed in the following manner. Since no large amount of current flows thru resistance 34, resistance 45, and transistor 60, junctions 35, 36, and 47 are substantially at 26 volts. There is no current flow thru transistor 30 and the voltage between the emitter and collector of transistor 30 is substantially 26 volts which puts point 55 at zero volts. The 26 volts at base 42 is coupled thru zener diode 73 internal to MOSFET 40 to gate 44. The 26 volts at gate 44 back-biases diode 50. Drain electrode 41 and base electrode 42 are substantially at 26 volts and field effect transistor 40 does not conduct.

A switching signal is then developed at switching signal source 80 of about 5 volts which causes the base electrode 62 to go positive with respect to emitter electrode 63 and current begins flowing thru the emitter to the collector 61. This current flows thru resistors 34 and 45 to cause voltage drops across each of the resistors. As this happens junction 47 drops in voltage causing the base electrode 42 of MOSFET 40 to drop. In addition, the voltage at junction 36 coupled to source electrode 43 drops. This causes back-biasing of zener diode 73 internal to field effect transistor and keeps a 26 volt potential on gate electrode 44 due to the charge on back-biased diode 50 and causes MOSFET 40 to conduct. As it conducts, the drain electrode 41 coupled to base electrode 32 drops in voltage and transistor 30 commences to conduct. As this happens, the voltage drop between the emitter 31 and collector 33 of transistor 30 decreases and the voltage at junction 53 increases. When this happens this voltage forward biases diode 50, biasing gate 44 positive with respect to source 43, held substantially fixed in voltage by resistor network, resistance 34, 45 and latches on MOSFET 40.

When excessive load current is drawn thru transistor 30, its base to emitter voltage increases, decreasing the voltage at junction 53. This decreased voltage is coupled to MOSFET gate 44, via diode 50. This decreased voltage on gate 44 reduces the gate to source bias and increases the resistance, drain to source, of MOSFET 40. The increased resistance reduces base current of transistor 30, reducing available collector current and causes the base to emitter voltage of transistor 30 to further increase, further decreasing the gate to source bias of MOSFET 40. The effect of this is to dramatically turn off the switch transistor 30 and remove the overload from the circuit.

Normal, non-overload, shutoff is made by removing the 5 volt signal supplied by switching signal source 80 from base 62, of transistor 60. Removing the 5 volt signal when the circuit has been latched off due to an overload condition, also restores the circuit to the off condition, that is transistor 30 not conduction, and allows reinitiation of circuit turn-on by reapplying the 5 volt control signal.

Obviously many modifications and variations of the present invention are possible in the light of the above teachings. It is therefore to be understood that within the scope of the appended claims the invention may be practiced otherwise than as specifically described.

I claim:

1. An improved low power driver switching circuit having capabilities of high speed switching between "on" and "off" and having a very low current drain, comprising:
   a. a first semi-conductor device having base, emitter, and collector electrodes;
   b. a second semi-conductor device having source, drain, base, and gate electrodes;
   c. a third semi-conductor device having anode and cathode electrodes;
   d. a fourth semi-conductor device having base, emitter and collector electrodes;
   e. an input power circuit having a positive terminal and a low voltage end and including a voltage dividing network;
   f. an output terminal coupled to a device to be switched;
   g. means for connecting said emitter electrode of said first semi-conductor device to the positive terminal of said input circuit, for connecting said collector electrode of said first semi-conductor to said output terminal, and for connecting said base electrode to said drain electrode of said second semi-conductor device;
   h. means for connecting said third semi-conductor device between said collector electrode of said first semi-conductor device and said gate electrode of said second semi-conductor device;
   i. means for connecting said source electrode of said second semi-conductor device to a predetermined point in said input voltage divider network;
   j. means connecting said fourth semi-conductor device between ground and one end of said voltage dividing network, said fourth semi-conductor device receiving switching signals and initiating switching operations;
   k. means for connecting said base electrode of said second semi-conductor device to said low voltage end of said input voltage divider network; said third semi-conductor device maintaining the voltage at said gate electrode of said second device at substantially the input voltage until switching operations is initiated; said voltage dividing network causing voltage at said source electrode to go negative with regard to the input voltage upon initiation of the switching operation, said voltage causing a very rapid switching in response to the initiation of the switching cycle.

2. The improved switching circuit of claim 1 wherein said voltage dividing network includes a first resistance and a second resistance and said fourth semi-conductor device network.

3. The improved switching circuit of claim 2 wherein said second semi-conductor device is a metallic oxide silicon field effect transistor including an internal zener diode.

4. The improved switching circuit of claim 3 wherein an overload condition is cleared by actuating said collector gate of said MOSFET transistor to the off position.

* * * * *